United States Patent
Otremba

(12) 
(10) Patent No.: US 10,229,870 B2
(45) Date of Patent: Mar. 12, 2019

(54) PACKAGED SEMICONDUCTOR DEVICE WITH TENSILE STRESS AND METHOD OF MAKING A PACKAGED SEMICONDUCTOR DEVICE WITH TENSILE STRESS

(71) Applicant: Infineon Technologies AG, Neubiberg (DE)

(72) Inventor: Ralf Otremba, Kaufbeuren (DE)

(73) Assignee: Infineon Technologies AG, Neubiberg (DE)

( * ) Notice: Subject to any disclaimer, the term of this patent is extended or adjusted under 35 U.S.C. 154(b) by 442 days.

(21) Appl. No.: 13/691,587

(22) Filed: Nov. 30, 2012

(65) Prior Publication Data

US 2014/0151866 A1 Jun. 5, 2014

(51) Int. Cl.
| | |
|---|---|
| *H01L 23/495* | (2006.01) |
| *H01L 21/50* | (2006.01) |
| *H01L 23/29* | (2006.01) |
| *H01L 23/00* | (2006.01) |

(52) U.S. Cl.
CPC ........ *H01L 23/49575* (2013.01); *H01L 21/50* (2013.01); *H01L 23/293* (2013.01); *H01L 23/495* (2013.01); *H01L 23/49513* (2013.01); *H01L 23/49548* (2013.01); *H01L 23/562* (2013.01); *H01L 24/73* (2013.01); *H01L 2224/05624* (2013.01); *H01L 2224/05647* (2013.01); *H01L 2224/05655* (2013.01); *H01L 2224/32245* (2013.01); *H01L 2224/45015* (2013.01); *H01L 2224/45124* (2013.01); *H01L 2224/45144* (2013.01); *H01L 2224/48091* (2013.01); *H01L 2224/48247* (2013.01); *H01L 2224/48464* (2013.01); *H01L 2224/73265* (2013.01); *H01L 2224/85099* (2013.01); *H01L 2224/85399* (2013.01); *H01L 2924/13091* (2013.01); *H01L 2924/1461* (2013.01); (Continued)

(58) Field of Classification Search
CPC .......... H01L 21/50; H01L 2924/00012; H01L 23/49575
USPC ................................................... 257/676, 77
See application file for complete search history.

(56) References Cited

U.S. PATENT DOCUMENTS

| | | | |
|---|---|---|---|
| 5,049,976 A | * | 9/1991 | Demmin ........... H01L 23/49503 257/717 |
| 6,876,053 B1 | | 4/2005 | Ma et al. |
| 2002/0011652 A1 | * | 1/2002 | Pogge .......................... 257/668 |

(Continued)

FOREIGN PATENT DOCUMENTS

| | | |
|---|---|---|
| DE | 102011053362 A1 | 3/2012 |
| DE | 102012102124 A1 | 9/2012 |

OTHER PUBLICATIONS

Baltes, H., et al., "Advanced Micro—and Nanosystems," CMOS—MEMS, 2005, Figure 6.14, vol. 2, Wiley-VCH, Weinheim.

(Continued)

*Primary Examiner* — Dale E Page
*Assistant Examiner* — Wilner Jean Baptiste
(74) *Attorney, Agent, or Firm* — Slater Matsil, LLP

(57) ABSTRACT

An assembled semiconductor device and a method of making an assembled semiconductor device are disclosed. In one embodiment the assembled device includes a carrier having a first thickness, a connection layer disposed on the carrier and a chip disposed on the connection layer, the chip having a second thickness, wherein the second thickness is larger than the first thickness.

24 Claims, 5 Drawing Sheets

(52) U.S. Cl.
CPC .............. *H01L 2924/181* (2013.01); *H01L 2924/3025* (2013.01); *H01L 2924/3511* (2013.01)

(56) References Cited

U.S. PATENT DOCUMENTS

| | | | | |
|---|---|---|---|---|
| 2003/0001249 A1* | 1/2003 | Shimanuki | ..................... | 257/678 |
| 2003/0022464 A1* | 1/2003 | Hirano | .................. | H01L 21/565 |
| | | | | 438/460 |
| 2004/0089926 A1 | 5/2004 | Hsu et al. | | |
| 2004/0089942 A1 | 5/2004 | Mamitsu et al. | | |
| 2005/0179109 A1* | 8/2005 | Ma et al. | ..................... | 257/500 |
| 2005/0287846 A1 | 12/2005 | Dozen et al. | | |
| 2006/0043579 A1 | 3/2006 | He et al. | | |
| 2007/0138650 A1* | 6/2007 | Ito | ..................... | H01L 23/49513 |
| | | | | 257/779 |
| 2007/0152328 A1 | 7/2007 | Jadhav et al. | | |
| 2007/0166877 A1* | 7/2007 | Otremba | ........... | H01L 23/49513 |
| | | | | 438/106 |
| 2007/0205253 A1* | 9/2007 | Hubner | ................ | B23K 1/0016 |
| | | | | 228/193 |
| 2008/0023805 A1* | 1/2008 | Howard | .............. | H01L 23/3121 |
| | | | | 257/666 |
| 2009/0166826 A1 | 7/2009 | Janducayan et al. | | |
| 2009/0261472 A1* | 10/2009 | Bayerer | ........................ | 257/719 |
| 2009/0278244 A1 | 11/2009 | Dunne et al. | | |
| 2010/0035381 A1* | 2/2010 | Yoshimura | ............ | H01L 21/563 |
| | | | | 438/109 |
| 2010/0051963 A1* | 3/2010 | Otremba | ......................... | 257/77 |
| 2011/0037153 A1 | 2/2011 | Zhu et al. | | |
| 2011/0127314 A1* | 6/2011 | Heinrich | .............. | B23K 1/0006 |
| | | | | 228/123.1 |
| 2012/0061812 A1 | 3/2012 | Otremba | | |
| 2012/0208323 A1* | 8/2012 | Heinrich | ................. | H01L 24/83 |
| | | | | 438/123 |
| 2012/0235227 A1 | 9/2012 | Otremba et al. | | |
| 2012/0313190 A1 | 12/2012 | Goel et al. | | |

OTHER PUBLICATIONS

Abdullah, Z., et al., "High Temperature Storage Performance for Au Sn Diffusion Soldering on Cu Leadframe Substrate," 34th International Electronic Manufacturing Technology Conference, 2010, 4 pages.

"Total Strained Silicon," Technologies and Applications, Paul Scherrer Institute, Oct. 24, 2012, 2 pages.

* cited by examiner

PACKAGED SEMICONDUCTOR DEVICE WITH TENSILE STRESS AND METHOD OF MAKING A PACKAGED SEMICONDUCTOR DEVICE WITH TENSILE STRESS

TECHNICAL FIELD

The present invention relates generally to packaged semiconductor components and more particularly to packaged planar semiconductor chips.

BACKGROUND

The consumer market demand for semiconductor devices with enhanced performance, more diverse functionality and improved reliability has driven technological innovations in all involved technical fields. This is also true for the areas of packaging and assembly which constitute the last phase of single or multiple chip fabrication. Packaging provides the necessary interconnects between a chip and a chip carrier as well as a protective enclosure of the assembly protecting it against chemical or mechanical damage.

The occurrence of thermo-mechanically induced stress defects in packaged components is a critical problem impacting the lifetime of electronic devices. Delamination or crack formations at device interfaces or solder joint failures are typical issues for these devices.

SUMMARY OF THE INVENTION

In accordance with an embodiment of the invention an assembled device comprises a carrier comprising a first thickness, a connection layer disposed on the carrier and a chip disposed on the connection layer, the chip comprising a second thickness, wherein the second thickness is larger than the first thickness.

In accordance with an embodiment of the invention an assembled device comprises a carrier, a connection layer disposed on the carrier and a planar chip comprising a top surface and a bottom surface, the planar chip being disposed with the bottom surface on the connection layer, wherein the top surface of the planar chip comprises a tensile stress.

In accordance with an embodiment of the invention an assembled device comprises a carrier, a connection layer disposed on the carrier and a chip comprising a top surface and a bottom surface, the chip being disposed with the bottom surface on the connection layer, the chip further comprising a first source/drain contact at the top surface and a second source/drain contact at the top surface, wherein the chip comprises a tensile stress between the first source/drain contact and the second source drain contact.

In accordance with an embodiment of the invention a method of manufacturing a semiconductor device comprises placing a semiconductor substrate with a bottom main surface onto a leadframe thereby forming a tensile stress at a top main surface of the semiconductor substrate, the leadframe comprising a larger thickness than the semiconductor substrate.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 illustrates a cross-sectional view of a chip/carrier assembly, wherein FIG. 1a depicts the assembly of the chip-to-carrier attachment at the start of bonding while FIG. 1b shows the bonded assembly after cooling down;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely with respect to packaged planar semiconductor devices. The invention may also be applied, however, to other packaged semiconductor devices or packaged components.

Packaging of a semiconductor component comprises in general the attachment of a component (e.g., die or chip) to a component carrier, thereby forming a mechanical and/or electrical component carrier contact.

Figure 1:
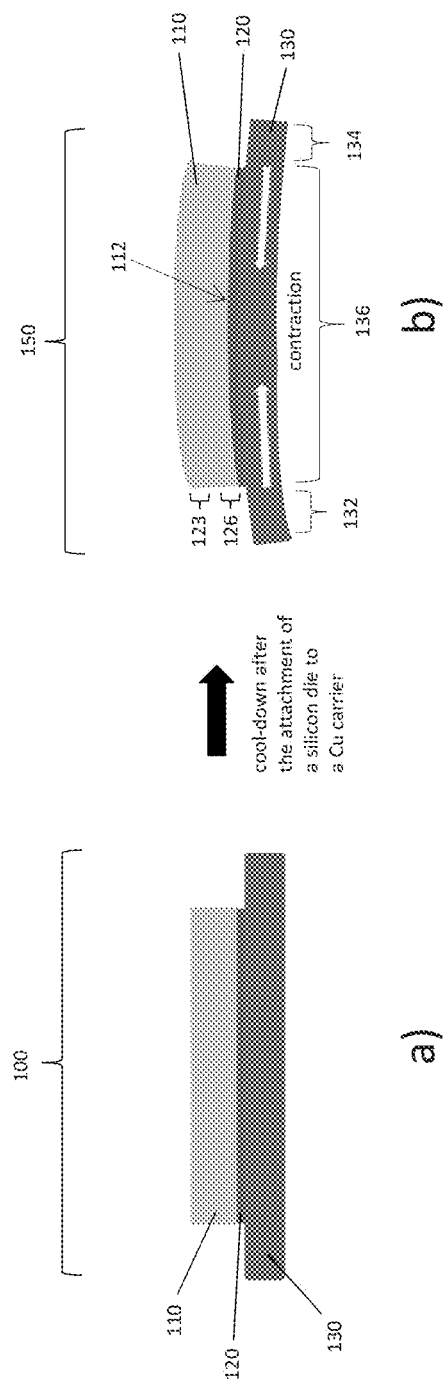

Bonding a die to a carrier is carried out at elevated temperatures, generally at temperatures in the range of 200° C. to 400° C. FIG. 1 illustrates in a simplified manner the initial and the final stages of a die-to-carrier assembly. FIG. 1a shows an assembled semiconductor device 100 at the moment of the first physical contact of a semiconductor die 110, a connecting layer 120 and a die carrier 130. At this stage at the beginning of the bonding process the assembly 100 has not yet developed stress originating from the die 110/carrier 130 joint. In contrast, FIG. 1b shows the assembled state 150 after the completion of the bonding process. In between, the assembled semiconductor device 100 was warmed up to an elevated temperature and subsequently cooled down to room temperature.

During the cool-down phase all elements of the assembly 100/150 will be subjected to contraction forces based on coefficients of thermal expansion (CTE) of the materials involved. Since the CTEs of the involved materials are generally different—CTE matching attempts, if made, may only partially reduce CTE mismatch—the cooled-down assembly 150 will comprise internal stress resulting from the die 110/carrier 130 joint. This will result in mechanical distortions in the assembly 150, leading to a slight upward or downward bowing of the assembly 150 layers. FIG. 1b shows in an exaggerated manner downward bowing. This type of distortion may be observed, for example, when employing metallic carriers 130 exhibiting relatively high CTEs.

Each individual element of the assembled packaged component 150 may influence the other elements in the packaged component 150. In particular, thick layers may have a stronger impact on the stress-induced distortion than thin layers. For example, the distortion may be higher the closer the thick layers are positioned to each other and the larger the CTE differences are between them.

The observed stress may be tensile or compressive in nature. By accepted nomenclature tensile stress is indicated by positive values and compressive stress by negative values. The stress observed within a particular region of the packaged component 150 may be non-uniform and orientation dependent. The stress within a top region of the semiconductor chip 110 may be different in magnitude and/or sign, than that of the bottom region of the chip 110. Similarly, the carrier regions 130, 132 at the periphery of the carrier 130 may exhibit comparatively lower surface warpage and lower stress values than the central carrier region 136.

Stress created in the architecture of an electrical component may become a reliability issue. This is well known. However, using stress to improve the electrical performance of semiconductor devices in packaging configurations is not known.

Embodiments of the present invention use compressive and/or tensile stress based on a component carrier interface such that the electrical performance of the component is improved. Various embodiments provide tensile stress to a top main surface of a planar device (where the active devices are located) and a compressive stress at a bottom main surface of the planar device. In some embodiment the tensile stress comprises values exceeding 100 MPa.

In some embodiments the device performance is improved by the presence of tensile stress in a direction parallel to the direction of the current flow. Moreover, in some embodiments, compressive stress in the direction parallel to the direction of the current flow should be avoided because it degrades device performance. In various embodiments the tensile stress induces an increase in electron mobility, resulting in device performance advantages regarding speed and power consumption. A reduction in effective electron mass and a reduction in electron scattering are believed to be the mechanisms leading to the observed increase in electron mobility.

Figure 2:
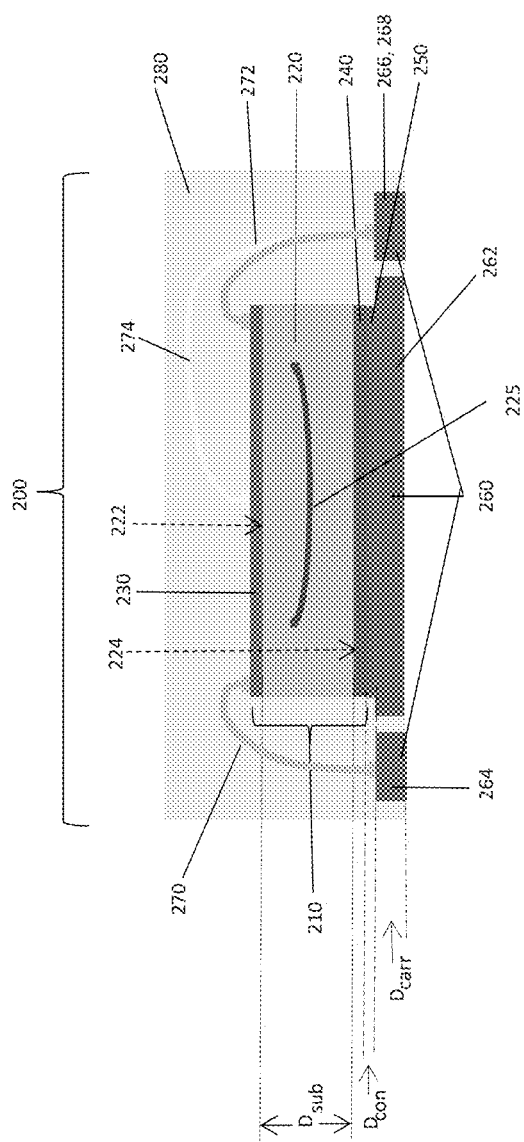
FIG. 2 illustrates a cross-sectional view of an embodiment of a packaged planar semiconductor component comprising a tensile stress at the top surface of the semiconductor component.

FIG. 2 illustrates a cross-sectional view of an embodiment of a packaged semiconductor component 200. The packaged semiconductor component 200 comprises a semiconductor chip 210, bonded to the central portion 262 of a chip carrier 260 via a connecting layer 250. The semiconductor chip 210 comprises a semiconductor substrate 220. An upper first main surface 222 of the substrate 220 is covered by a terminal layer 230. A backside metallization (BSM) layer 240 is disposed below a second main surface 224 of the semiconductor substrate 220, wherein the second main surface 224 faces the carrier 260. Furthermore the packaged component 200 comprises interconnection elements 270, 272, 274 extending from defined regions (or component contacts) of the terminal layer 230 to peripheral portions 264, 266, 268 of the carrier 260. Moreover the semiconductor chip 210, the interconnects 270, 272, 274 and the chip carrier 260 are fully or partially enclosed by an encapsulant 280.

In various embodiments the semiconductor substrate 220 may comprise a single element semiconductor material such as silicon or germanium. Alternatively, the semiconductor substrate 220 comprises a compound semiconductor material such as SiC, SiGe, InP, InAs, GaAs, GaN or GaP. The semiconductor substrate 220 may comprise a single bulk semiconductor material only, or alternatively, a combination of an epitaxial semiconductor layer disposed over a bulk semiconductor. The thickness of an epitaxial or bulk semiconductor layer may, for example, be equal to or greater than 20 μm, 50 μm, or 100 μm. The total thickness of the semiconductor substrate 220 may be as high as 1000 μm. In some embodiments the semiconductor substrate 220 may comprise a silicon on insulator (SOI) substrate.

Several of the semiconductor materials mentioned above have CTE values in the range of 2.3 ppm/K to 7 ppm/K. The CTEs of Si and GaN, may be as low as 2.3 ppm/K and 3.2 ppm/K, respectively. Semiconductor materials with relatively high CTEs are, for example, Ge (5.8 to 5.9 ppm/K) or GaAs (5.7 to 6.9 ppm/K).

The semiconductor chip 210 may comprise a planar power device, e.g., a planar power MOSFET (Metal Oxide Semiconductor Field Effect Transistor) comprising a source, a drain and a gate region, all of them aligned along the first main surface 222. Alternatively the semiconductor chip 210 may comprise another type of semiconductor device such as a passive device, a MEMS or an optoelectronic device. The semiconductor chip 210 may be a stand-alone device or an integrated circuit.

In one embodiment the semiconductor chip 210 comprises a backside metallization (BSM) layer 240 disposed below the second main surface 224 of the semiconductor substrate 220. The BSM layer 240 may comprise a single layer or a plurality of layers comprising metal or metal alloy materials. For example, the BSM layer 240 may be a tri-layer stack of Al/Ti/NiV, a bi-layer stack comprising Al/Ti or Al/TiW, or it may be of more complex composition (e.g. Al/Ti/Cu/Sn/Ag or Al/TiW/Cu/Sn/Ag). The total thickness of a BSM stack 240 may be in the range of 0.5 μm to 5 μm. Alternatively, the BSM layer 240 comprises a thickness between 0.1 μm and 10 μm. The BSM layer (stack) 240 is configured to facilitate an effective heat transfer from the semiconductor chip 210 to the carrier 260.

The carrier 260 comprises a central portion 262, onto which the chip 210 is mounted, and peripheral regions (e.g. 264, 266, 268). The carrier 260 may be a metallic lead frame comprising materials with a CTE≥15 ppm/K such as copper (CTE 16.6 to 17.6 ppm/K), brass (CTE~20 ppm/K) or aluminum (CTE 23 to 24 ppm/K). The thickness of the lead frame 260 may be in the range of 50 μm to 1000 μm, or alternatively, between 100 μm and 500 μm.

In some embodiments rigid materials having CTEs significantly higher than that of the applied semiconductor substrate 220 may be applied as carrier 260 material. Low CTE materials such as most ceramic or CuMo with CTEs ranging between 4 ppm/K to 8 ppm/K may be less suitable for some embodiments of the invention, as explained below. On the other hand, Zirconia ceramics with CTEs around 10.5 ppm/K may be suitable as carrier materials, although their CTE values are roughly 30% lower than the CTEs of conventional metallic lead frame materials.

The connecting layer 250 facilitates the bonding of the chip 210 to the carrier 260. In one embodiment the connecting layer 250 may comprise a solder material such as AuSn, AgSn, CuSn or SnSb, enabling bonding to the metallic lead frame 260. In some embodiments the solder layer may exhibit high rigidity and be as thin as possible in order to minimize its effectiveness as stress buffer layer mitigating the stress originating from the die/carrier joint. In one embodiment the thickness of the solder material may be less than 20 μm. The solder layer 250 thickness may be as low as 1 μm to 3 μm. Solder thickness between 50 μm and 100

µm, as frequently used for conventional applications, may not be suitable for various embodiment of the invention.

In alternative embodiments the connecting layer 240 may be a conductive or non-conductive, organic or inorganic adhesive layer. Organic adhesive layers may comprise epoxy, epoxy/urethane, polyester or polyimide resins mixed with a cross-linking component. Electrically conducting adhesive layers may in addition comprise nano-particles (up to 85 volume-%) of metals/alloys such as Ag, Cu, Au, Ag-coated Ni or Au-plated Ni. Electrically conductive adhesive films may offer better thermal conductivity as non-conductive ones, thus providing more effective heat dissipation from the semiconductor device to the carrier 260. The thickness of the applied adhesive layers may be low, for example less than 50 µm. Alternatively, the thickness may be in the range of 5 µm to 20 µm.

The terminal layer 230 disposed above the first main surface 222 of the semiconductor substrate 220 may comprise electrically conductive contact pads (not shown) to which interconnection elements (e.g. 270, 272, 274) are attached. The contact pads may comprise one or more layers of high-conductivity metals (e.g. Cu, Al, Ni), metal alloys, solder material, conductive adhesive, or combinations thereof. Furthermore the terminal layer 230 may comprise insulating portions (not shown) which electrically insulate contact pads from each other. These insulating elements of the terminal layer 230 may comprise, for example, silicon oxide or silicon nitride. The contact pads may be conductively connected to active device elements. The contact pads may, for example, be disposed over the source, drain and gate regions of a planar power MOSFET.

The interconnection elements 270, 272, 274 may establish conductive paths between contact pads in the terminal layer 230 and peripheral portions of the lead frame 264, 266, 268 (so-called out-pads). Such interconnects may be wire bonds with diameters ranging between 16 µm and 500 µm. The wire bonds may comprise Au, Cu, Ag or Al, for example. Pre-fabricated (punched-out) metal parts of pre-defined configuration (so-called clips) may alternatively be employed instead of wire bonds. In general, for other feasible component architectures not shown in FIG. 2, interconnections between a top region of the chip 210 and the carrier 260 may be also be formed by other means, e.g., by employing through-hole vias built vertically through the chip 210 and connected to the carrier 260 by means of solder ball joints.

The packaged electrical component 200 comprises furthermore an encapsulant 280 which fully or partly encloses the chip 210, the carrier 260 and the interconnection elements 270, 272, 274. The encapsulant 280 may comprise epoxy, polyacrylate, polyurethane, polysulfone, polyimide or polyetherimide compounds, or other polymer compounds. When using encapsulation materials comprising elastic modulus E values around 13 000 MPa, the contribution of the encapsulation body 280 to mechanical forces acting on the critical device regions may be expected to remain small. Alternatively the encapsulant 280 may be a laminate rather than a molding compound.

In various embodiments the region 225 near the top surface of the semiconductor substrate 220 comprises a tensile stress parallel to the first main surface 222. The tensile stressed region 225 is configured to provide a current flow between about 0.1 A and 100 A. The region 225 may be disposed between the first source/drain region of the semiconductor device 210 and the second source/drain region of the semiconductor device. In some embodiments the tensile stress values are equal to or higher than 100 MPa. In other embodiments tensile stress values higher than 1 GPa are avoided in order to minimize stress-induced defects in the packaged component 200, such as delaminations or cracks.

The tensile stress within the top region 225 of the semiconductor substrate 220 is originated predominantly by mechanical forces at the die 210/carrier 260 joint. In some embodiments the semiconductor substrate 220 and the carrier 260 have the strongest impact on the tensile stress region while other sources such as the interface die/encapsulant 210/280, the BSM layer 240 or the connecting layer 250 play a minor role.

In various embodiments the most influential parameter influencing the tensile stress in the device region 225 is the difference in CTEs of the semiconductor substrate 220 and the carrier 260. In some embodiments the device 210 performance increases if the thickness of the semiconductor substrate 220, $D_{sub}$ is larger than the thickness of the carrier 260, $D_{carr}$. For example, $D_{sub}$ should be as large as possible and $D_{carr}$ should be as thin as possible. In some embodiments compressive stress at region 225 or at the top surface 222 is avoided.

In some embodiment the connecting layer 250 is as small as possible to avoid buffer effects. In particular, a thick connecting layer 250 may mitigate the CTE difference between the semiconductor substrate 220 and the carrier.

In some embodiments the tensile stress at surface of the semiconductor device 210 improves electron mobility for planar devices. In particular, the resistivity is substantially reduced compared to conventional devices.

In some embodiments a larger difference between the CTE of the substrate 220 and the CTE of the carrier 260 produces higher stress in the joint region. In various embodiments the CTE of the carrier is at least a factor 2 higher than the CTE of the semiconductor device.

Figure 3:
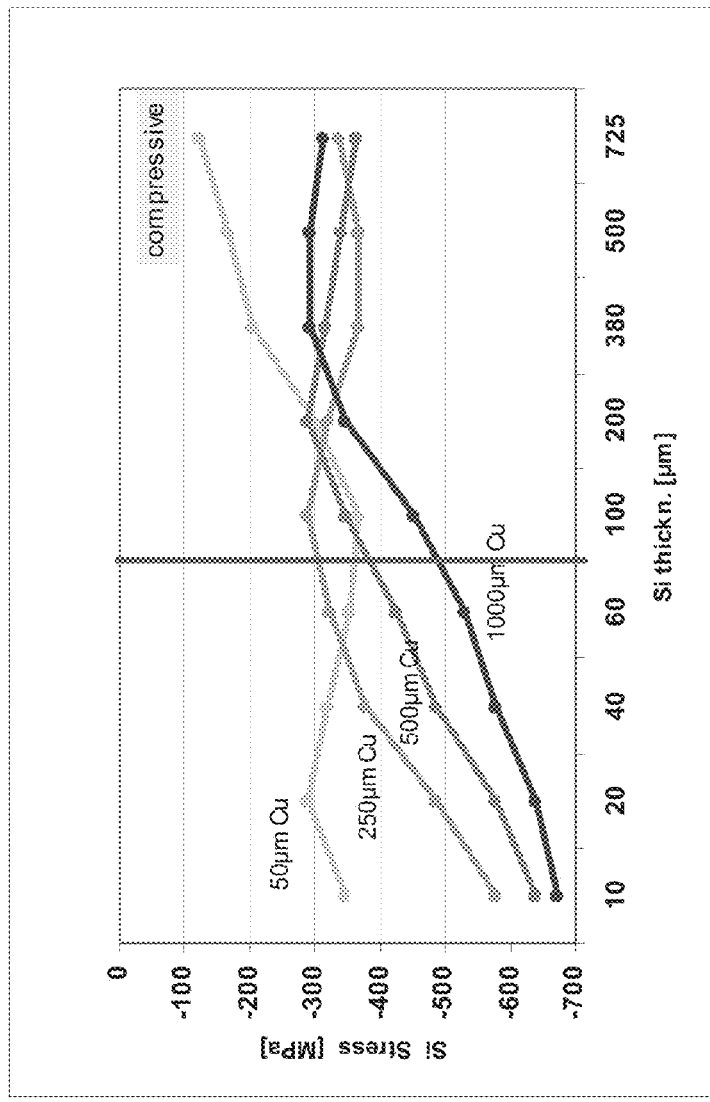
FIG. 3 shows a plot of experimental data illustrating different stress levels for different combinations of silicon/copper leadframe thicknesses at the bottom surface of the silicon chip.
Figure 4:
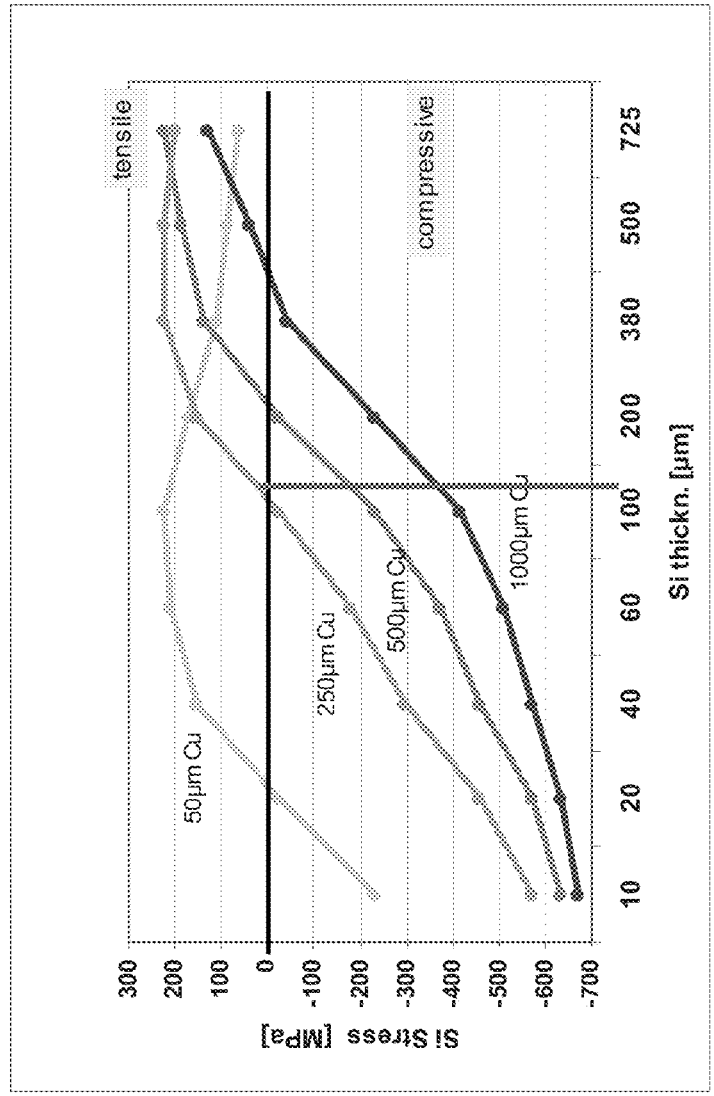
FIG. 4 shows a plot of experimental data illustrating different stress levels for different combinations of silicon/copper leadframe thicknesses at the top surface of the silicon chip.

FIGS. 3 and 4 show resulting stress values for different silicon substrate 220 and leadframe 260 thicknesses at the chip bottom side (FIG. 3) and the chip top side (FIG. 4). These two Figures show experimental data with respect to a set of silicon die/copper lead frame assemblies with varying silicon and lead frame thickness values. The silicon thickness was changed between 10 µm and 725 µm, and the thickness of the copper lead frame was changed between 50 µm and 1000 µm. The measured stress values refer to the assembled semiconductor device 200 after cooled-down from a bonding temperature of 300° C.

With regard to FIG. 3, compressive stress was found at the chip bottom over the whole investigated ranges of silicon thickness and copper lead frame thickness. For a copper thickness range from 250 µm to 1000 µm the compressive stress decreased (meaning a shift to lower negative values) with increasing silicon thickness. This trend leveled off for silicon thicknesses exceeding 200 µm, with exception of the 50 µm Cu case wherein the trend continued up to upper end of the investigated silicon thickness range (725 µm).

FIG. 4 shows stress values at the chip top region which comprises the silicon region relevant for electron mobility/device performance enhancement. For a copper lead frame thickness range from 250 µm to 1000 µm an increase in silicon chip thickness went along with a gradual shift from compressive stress to tensile stress. For a lead frame thickness of 50 µm the highest tensile stress values were found for silicon thicknesses of 60 µm and 100 µm, but the tensile stress degraded if the silicon thickness was further raised beyond 100 µm.

In one embodiment the ratio of the thickness of the semiconductor substrate 220, $D_{sub}$, to the carrier 260 thickness, $D_{carr}$, varies between 1 and 2 (e.g., $1 \le D_{sub}/D_{carr} \le 1.33$;

$1.33 \leq D_{sub}/D_{carr} \leq 1.66$ or $1.66 \leq D_{sub}/D_{carr} \leq 2$). In contrast, the semiconductor substrate thickness of conventionally built components is in many cases significantly thinner than the thickness of the carriers employed. Often the total chip thickness of a conventional component is about half of its carrier thickness.

Figure 5:
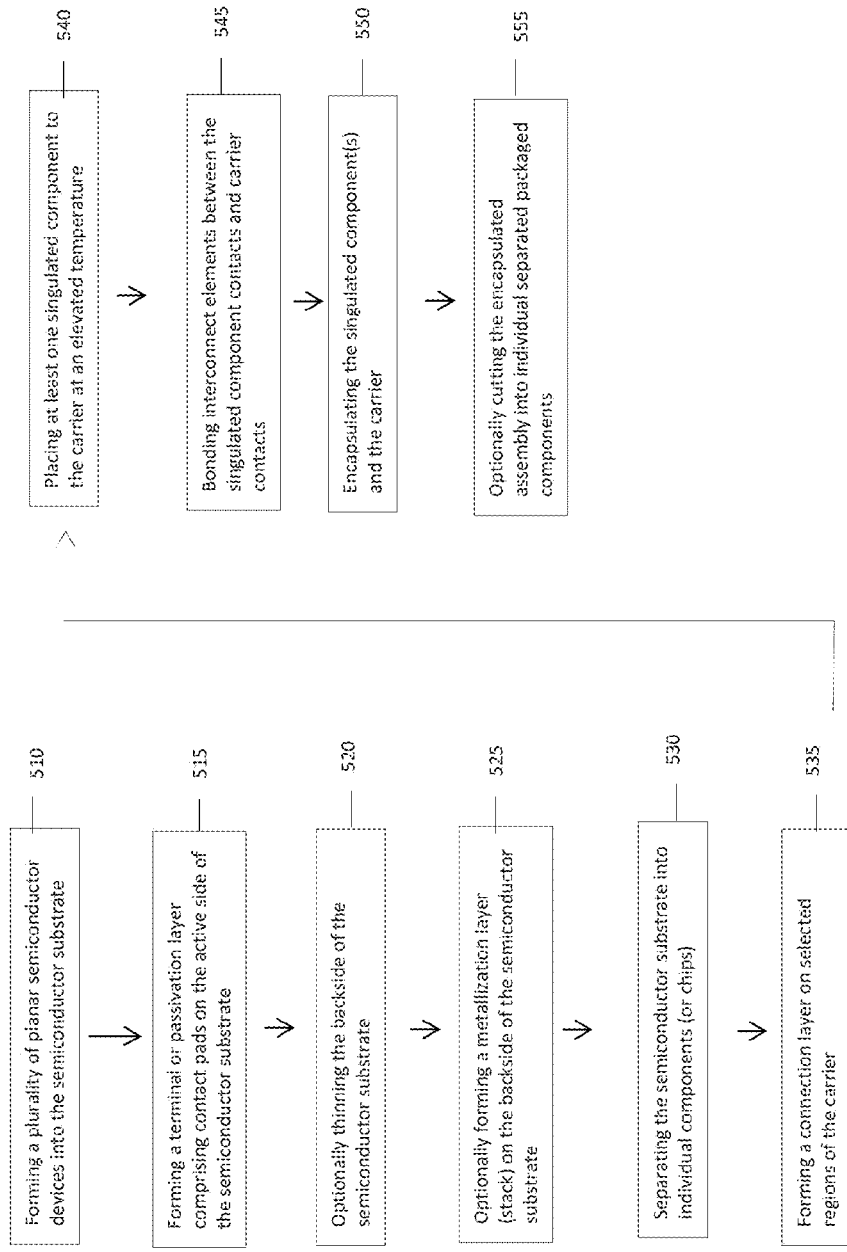
FIG. 5 shows an embodiment of a method for manufacturing a packaged planar semiconductor component comprising tensile stress in the top region of its semiconductor substrate.

FIG. 5 shows a flow chart of an embodiment to manufacture a packaged planar semiconductor component comprising tensile stress in the top region of its semiconductor substrate.

In a first step 510 a plurality of planar semiconductor devices is manufactured into/onto a semiconductor substrate. Step 510 represents a sequence of processing steps dedicated to the formation of active device elements and interconnects along an upper main surface of the semiconductor substrate. In step 515, a terminal or passivation layer is formed on upper main surface of the semiconductor substrate. The terminal layer insulates contact pads on the first main surface of the semiconductor devices from each other.

In step 520, the semiconductor substrate is optionally thinned. The wafer typically comes in a standard thickness and need to be thinned to the pre-determined optimum thickness value. Wafer thinning may be achieved by grinding or lapping, for example. Grinding tools may employ an abrasive wheel. Lapping tools use a liquid fluid (termed "slurry") comprising abrasive particles acting between two surfaces. Chemical mechanical polishing (CMP) is a further process option for wafer thinning which utilizes a combination of mechanical abrasion and chemical attack.

In the next step 525, a backside metallization (BSM) layer may be optionally formed on the backside of the semiconductor substrate (e.g., backside of the wafer). The wafer may be temporarily glued with its upper main surface to a support wafer. Then a backside metallization (BSM) layer is deposited on the substrate backside. The BSM layer may comprise one or more layers of metal or metal alloys. Possible material options are already mentioned above. The BSM layer(s) may be deposited, for example, by ion beam sputtering, reactive sputtering, electroplating or chemical vapor deposition (CVD). Higher sputter temperatures may favor higher tensile stress in the top chip region.

In step 530, the semiconductor wafer comprising the devices is cut or separated into individual chips. The semiconductor wafer may be cut by a saw or a laser, for example.

Subsequently, in step 535, a carrier is prepared for the attachment of at least one of the singulated chips by depositing a connecting layer material on defined regions at the top surface of the carrier. In one embodiment a diffusion solder material of high rigidity is applied. AuSn, AgSn, CuSn or AgIn may be used as solder materials. The solder layer may be formed over the whole carrier in a blanket deposition by applying electroplating, vapor deposition or evaporation sputtering techniques. Subsequently the solder may be removed from areas intended to be solder-free by a combination of conventional lithography and etching steps, or by laser ablation employing high energy Nd:YAG or excimer lasers. Alternatively, the solder layer is selectively deposed by applying techniques such as rim shielding, spray/sprinkle application, or stencil printing (e.g. applying solder paste).

In another embodiment a metallic ink layer may be selectively applied to the carrier. Metallic inks comprise particles comprising metal/alloy materials such as Ag, Cu, or Ag-coated Cu or Ni. The metallic ink particles may be a few tens of nm in size.

In another embodiment conductive or non-conductive adhesive paste may be applied as connecting layer to defined locations on the carrier, using a paste dispense system. Adhesive pastes comprise a solvent. After paste deposition the solvent is removed through a drying process in an oven or by flow of hot air. The drying of the adhesive pasted is followed by curing it for a few minutes at temperatures of about 100° C. to about 250° C. Alternatively, an adhesive material may be applied in form of pre-fabricated portions of an adhesive foil (called preforms). The thickness of such preforms may range from 5 µm to 10 µm. If a preform material comprises a UV-sensitive component, the preform may be UV cured for about 1 sec to about 20 sec, the curing time depends on the preform thickness. Alternatively thermal curing at temperatures in the range of about 130° C. to about 160° C. may be carried out, with curing times ranging from about 20 sec to about 60 sec.

In step 540, at least one semiconductor chip is attached to the carrier, with the non-active chip backside(s) facing the carrier. A first chip is picked up with conventional pick & place equipment and placed over a defined portion of the preheated carrier. Subsequently the accurately aligned chip is bonded to the carrier at an elevated temperature. In some embodiments, pick-up, placement and chip-to-carrier bonding may be repeated.

The bonding temperature depends on the nature of the connecting material. If the selected attachment layer comprises a diffusion solder material, thermocompression bonding may be applied to attach the chip to the carrier. Bonding temperatures for diffusion solder materials are generally in the range of about 300° C. to about 400° C. In order to achieve a higher stress at the die/carrier joint, bonding may preferably be carried out at temperatures ranging between about 350° C. and about 400° C. Exemplary processing conditions for 75% Au/25% Sn solder bonding are: 1200 nm, 360° C., 350 ms, bond force 3.3 N/mm², bond soft delay 150 ms, in bonding tunnel with forming gas atmosphere (85% $N_2$+15% $H_2$)

In a further embodiment the chip and the carrier may be sintered together with an intermittent metallic ink layer at temperatures between about 200° C. and about 250° C., while applying pressure in the range of about 1 MPa to about 5 MPa for min. 1 to 2 min. In yet another embodiment the chip/carrier bonding may involve bonding to an electrically conductive or non-conductive layer of adhesive film or paste. For such materials the bonding temperature may range between about 180° C. and about 250° C.

In step 545 interconnection elements are attached. The ends of wire bonds or external clips are bonded to corresponding contact pads at the terminal layer of the semiconductor chip and the carrier. If the carrier is a metallic lead frame, the interconnection elements are bonded to peripheral out-pads of the lead frame. For signal interconnects Au wire bonds with diameters ranging from about 16 µm to about 40 µm are frequently used. Significantly thicker Al wires with diameters ranging between about 100 µm and about 500 µm are generally applied for inter-connects in the load path of an electrical system. The bonded ends of wires may be either ball or wedge shaped. Formation of ball shaped wire ends may be accomplished using a hydrogen flame or by application of a capacitive discharge technique. Ball bonding may be carried out in a shield gas atmosphere of Ar with 10% $H_2$, while $N_2$+10% $H_2$ are used for wedge bonding.

Three different wire bonding techniques are available: ultrasonic, thermocompression and thermosonic bonding. Ultrasonic bonding is only applicable to wedge bond formation. The other two techniques may be used for either ball or wedge bonding. Ultrasonic bonding utilizes ultrasonic energy in the range of about 20 kHz to about 60 kHz, applying at room temperature a bond load of 0.5 g to 2.5 g per wire bond during bonding times around 20 ms. Ultrasonic wedge bonding is the preferred bonding method for aluminum wires. Thermocompression bonding is carried out at temperatures ranging between about 300° C. and about 500° C., applying 15 g to 25 g bond load per wire bond. Thermosonic bonding uses a combination of heat, ultrasonic energy (in the 60-120 kHz range) and pressure. Thermosonic bonding may be carried out employing lower heat and lower pressure than used for thermocompression bonding. Temperatures ranging from 125° C. to 150° C. and bond loads between 0.5 g and 2.5 g per wire bond are sufficient for this bonding technique.

In step 550 the attached component(s), the attached interconnects and the carrier are fully or partially encapsulated. The encapsulation material may comprise a molding compound, a laminate or a glob top coating. Various techniques for the encapsulation with a dielectric material may be applied such as compression molding, transfer molding, injection molding, powder or liquid molding, dispensing or laminating.

In high volume manufacturing a plurality of electrical components is attached to a carrier. In one embodiment an encapsulated assembly comprising one carrier and a plurality of semiconductor components is cut by a saw or a laser and thereby separated into separated packaged semiconductor components. This is shown in step 555.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, compositions of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods or steps.

What is claimed is:

1. An assembled device comprising:
a carrier comprising a first thickness;
a connection layer disposed on the carrier; and
a chip disposed on the connection layer, the chip comprising a second thickness,
wherein a ratio x is defined as a ratio between the second thickness and the first thickness, wherein the ratio x fulfills the requirement 1.33≤x≤2, and wherein the carrier is a leadframe wherein a top surface of the chip comprises a tensile stress and a bottom surface of the chip comprises a compressive stress.

2. The assembled device according to claim 1, wherein the second thickness is equal to or greater than 50 μm and the first thickness is equal to or less than 50 μm.

3. The assembled device according to claim 1, wherein the second thickness is equal to or greater than 100 μm and the first thickness is equal to or less than 100 μm.

4. The assembled device according to claim 1, wherein the connection layer comprises a third thickness, the third thickness being between 1 μm and 3 μm.

5. The assembled device according to claim 4, wherein the connection layer is a diffusion solder layer.

6. The assembled device according to claim 1, wherein the tensile stress is equal to or greater than 100 MPa.

7. The assembled device according to claim 1, wherein the ratio x fulfills the requirement 1.66≤x≤2.

8. The assembled device according to claim 1, wherein the leadframe is a copper leadframe.

9. An assembled device comprising:
a leadframe;
a connection layer disposed on the leadframe; and
a chip comprising a top surface and a bottom surface, the chip being disposed with the bottom surface on the connection layer,
wherein the top surface of the chip comprises a tensile stress and the bottom surface of the chip comprises a compressive stress, and
wherein the tensile stress at the top surface and the compressive stress at the bottom surface is generated by the chip being disposed on the connection layer and the connection layer being disposed on the leadframe.

10. The assembled device according to claim 9, further comprising:
interconnects connecting chip contact pads with leadframe contact pads; and
an encapsulation encapsulating the leadframe, the connection layer and the chip.

11. The assembled device according to claim 9, wherein the connection layer comprises a thickness of equal to or less than 20 μm.

12. The assembled device according to claim 9, wherein the tensile stress is equal to or greater than 100 MPa.

13. The assembled device according to claim 9, wherein a ratio x is defined as a ratio between a thickness of the chip and a thickness of the leadframe, and wherein the ratio x fulfills the requirement 1.33≤x≤2.

14. The assembled device according to claim 13, wherein the ratio x fulfills the requirement 1.66≤x≤2.

15. An assembled device comprising:
a leadframe;
a connection layer disposed on the leadframe; and
a chip comprising a top surface and a bottom surface, the chip being disposed with the bottom surface on the connection layer, the chip comprising only a single first source/drain contact at the top surface and only a single second source/drain contact at the top surface,
wherein the chip comprises a tensile stress between the first source/drain contact and the second source/drain contact, wherein the bottom surface of the chip comprises a compressive stress, and
wherein the tensile stress at the top surface and the compressive stress at the bottom surface is generated by the chip being disposed on the connection layer and the connection layer being disposed on the leadframe.

16. The assembled device according to claim 15, wherein the tensile stress is equal to or greater than wo MPa.

17. The assembled device according to claim 15, wherein the chip comprises a power semiconductor device.

18. The assembled device according to claim 17, wherein the connection layer comprises an organic adhesive layer or an inorganic adhesive layer with a thickness of equal to or less than 20 μm.

19. The assembled device according to claim 17, wherein the connection layer comprises a diffusion solder layer with a thickness of equal to or less than 3 µm.

20. The assembled device according to claim 15, wherein the connection layer is an organic adhesive or an inorganic adhesive layer.

21. The assembled device according to claim 15, wherein a ratio x is defined as a ratio between a thickness of the chip and a thickness of the leadframe, and wherein the ratio x fulfills the requirement $1.33 \leq x \leq 2$.

22. The assembled device according to claim 15, wherein the tensile stress is equal to or greater than 100 MPa and wherein the compressive stress is equal to or less than −200 MPa.

23. An assembled device comprising:
a carrier comprising a first thickness;
a connection layer disposed on the carrier; and
a chip disposed on the connection layer, the chip comprising a second thickness,
wherein a ratio x is defined as a ratio between the second thickness and the first thickness, wherein the ratio x fulfills the requirement $1.33 \leq x \leq 2$,
wherein the carrier is a leadframe comprising copper, wherein the chip comprises a substrate including silicon, and wherein the connection layer is a diffusion solder layer.

24. The assembled device according to claim 23, wherein the second thickness is equal to or greater than 50 µm and the first thickness is equal to or less than 50 µm.

\* \* \* \* \*

UNITED STATES PATENT AND TRADEMARK OFFICE
CERTIFICATE OF CORRECTION

PATENT NO. : 10,229,870 B2
APPLICATION NO. : 13/691587
DATED : March 12, 2019
INVENTOR(S) : Ralf Otremba Page 1 of 1

It is certified that error appears in the above-identified patent and that said Letters Patent is hereby corrected as shown below:

In the Claims

In Column 10, Line 61, Claim 16, delete "wo" and insert --100--.

Signed and Sealed this
Fourteenth Day of May, 2019

Andrei Iancu
*Director of the United States Patent and Trademark Office*